United States Patent
White et al.

(10) Patent No.: US 7,490,276 B1
(45) Date of Patent: *Feb. 10, 2009

(54) TESTING SELF-REPAIRING MEMORY OF A DEVICE

(75) Inventors: Christopher E. White, Plano, TX (US); Steven C. McMahan, Richardson, TX (US); John K. Eitrheim, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 228 days.

This patent is subject to a terminal disclaimer.

(21) Appl. No.: 11/255,383

(22) Filed: Oct. 20, 2005

Related U.S. Application Data

(63) Continuation of application No. 10/264,551, filed on Oct. 4, 2002, now Pat. No. 7,007,211.

(51) Int. Cl.
*G01C 29/00* (2006.01)
*G01R 31/28* (2006.01)

(52) U.S. Cl. .................. 714/718; 714/733; 714/734

(58) Field of Classification Search ............. 714/718, 714/724, 733, 734, 30, 726, 711, 732, 736, 714/738, 819, 735; 365/200, 201
See application file for complete search history.

(56) References Cited

U.S. PATENT DOCUMENTS

| | | | |
|---|---|---|---|
| 5,568,437 A | 10/1996 | Jamal | 365/201 |
| 5,617,531 A | 4/1997 | Crouch et al. | 714/30 |
| 5,936,900 A | 8/1999 | Hii et al. | 365/201 |
| 5,991,898 A | 11/1999 | Rajski et al. | 714/30 |
| 6,000,048 A | 12/1999 | Krishna et al. | 714/718 |
| 6,085,334 A | 7/2000 | Giles et al. | 714/7 |
| 6,154,861 A | 11/2000 | Harward | 714/719 |
| 6,158,036 A | 12/2000 | Kwak | 714/733 |
| 6,226,766 B1 | 5/2001 | Harward | 714/719 |
| 6,246,619 B1 | 6/2001 | Ematrudo et al. | 365/201 |
| 6,256,237 B1 | 7/2001 | Ho et al. | 365/200 |
| 6,285,620 B1 | 9/2001 | Ho et al. | 365/225.7 |
| 6,436,741 B2 | 8/2002 | Sato et al. | 438/149 |
| 6,574,763 B1 * | 6/2003 | Bertin et al. | 714/738 |
| 6,728,901 B1 | 4/2004 | Rajski et al. | 714/30 |
| 6,754,117 B2 * | 6/2004 | Jeddeloh | 365/201 |
| 7,127,647 B1 * | 10/2006 | Zorian et al. | 714/711 |
| 7,149,921 B1 * | 12/2006 | Zorian et al. | 714/6 |
| 7,149,924 B1 * | 12/2006 | Zorian et al. | 714/30 |
| 7,237,154 B1 * | 6/2007 | Zorian | 714/711 |

* cited by examiner

*Primary Examiner*—Phung M Chung
(74) *Attorney, Agent, or Firm*—Baker Botts L.L.P.

(57) ABSTRACT

Testing one or more memories of a device includes receiving one or more first repair records from one or more built-in self-testers of a device having one or more memories. A built-in self-tester is associated with a memory, and a first repair record describes a first repair at a memory. A first repair signature corresponding to the first repairs at the memories is generated from the first repair records, and then is recorded. One or more second repair records are received from the built-in self-testers, where a second repair record describes a second repair at a memory. A second repair signature corresponding to the second repairs at the memories is generated from the second repair records. The second repair signature is compared with the first repair signature. The device is evaluated in response to the comparison.

6 Claims, 3 Drawing Sheets

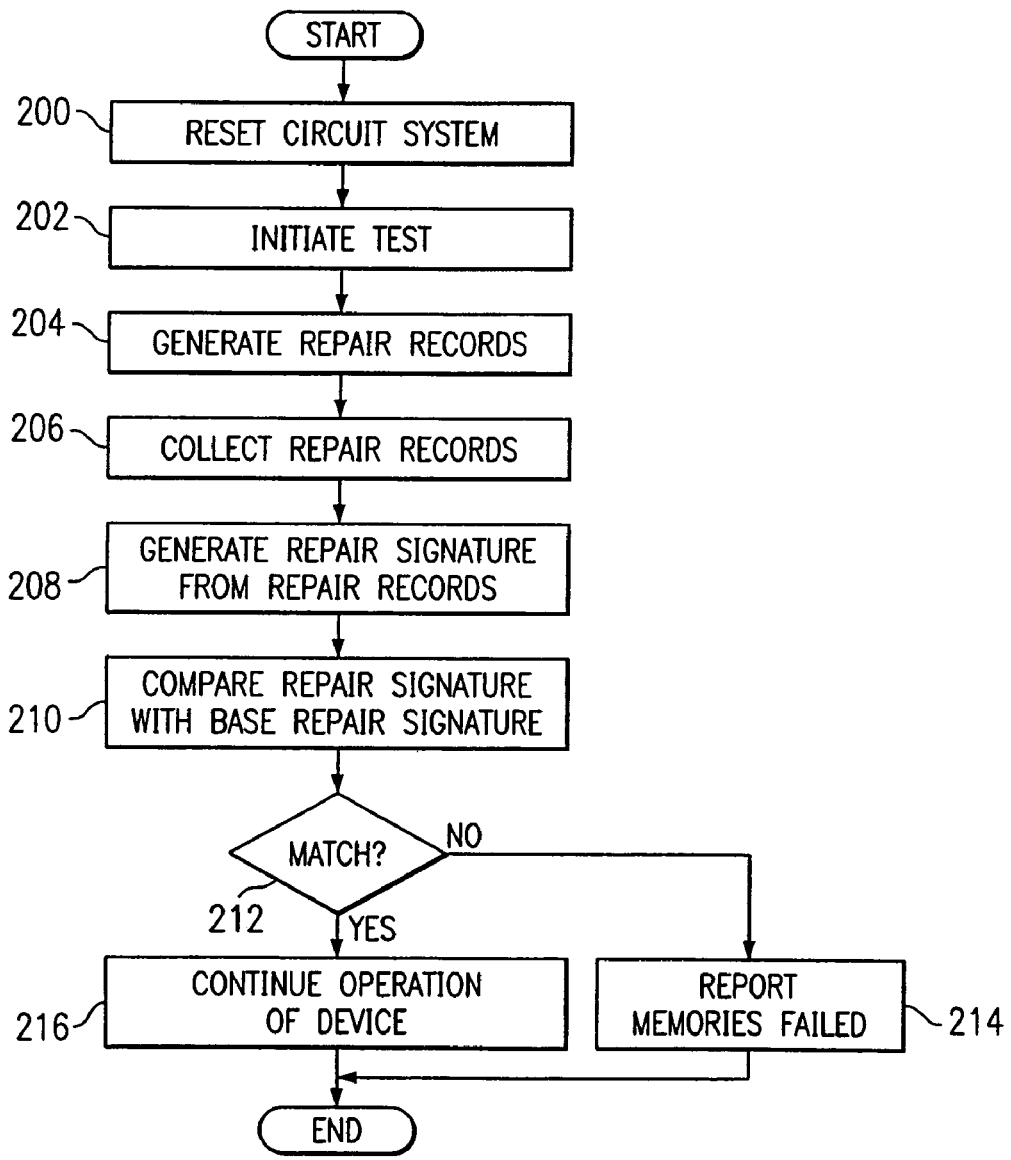

TESTING SELF-REPAIRING MEMORY OF A DEVICE

CROSS REFERENCE TO RELATED APPLICATION

This application is a continuation of U.S. application Ser. No. 10/264,551 filed Oct. 4, 2002 now U.S. Pat. No. 7,007,211 and entitled "Testing Self-Repair memory of a Device".

TECHNICAL FIELD OF THE INVENTION

This invention relates generally to the field of processor memory and more specifically to testing self-repairing memory of a device.

BACKGROUND OF THE INVENTION

Devices may include memory designed to repair its own defects. Known methods of self-repair, however, may require valuable device space or may not effectively repair multiple defects of large memories. Consequently, providing self-repairing memory for devices has posed challenges.

SUMMARY OF THE INVENTION

In accordance with the present invention, disadvantages and problems associated with previous techniques for testing self-repairing memory of a device may be reduced or eliminated.

According to one embodiment of the present invention, testing one or more memories of a device includes receiving one or more first repair records from one or more built-in self-testers of a device having one or more memories. A built-in self-tester is associated with a memory, and a first repair record describes a first repair at a memory. A first repair signature corresponding to the first repairs at the memories is generated from the first repair records, and then is recorded. One or more second repair records are received from the built-in self-testers, where a second repair record describes a second repair at a memory. A second repair signature corresponding to the second repairs at the memories is generated from the second repair records. The second repair signature is compared with the first repair signature. The device is evaluated in response to the comparison.

Certain embodiments of the invention may provide one or more technical advantages. A technical advantage of one embodiment may be that built-in self-testers perform repairs for individual memories of a device. Repairing each memory individually may provide for more flexible repair of memories. Another technical advantage of one embodiment may be that the memories of a device may be repaired under a single condition and still operate reliably under a variety of different conditions. Repair signatures generated from built-in self-testers performing under different conditions are compared to each other. If the repair signatures match, the self-repair may be shown to be reliable under a variety of conditions. Yet another technical advantage of one embodiment may be that using a signature to record initial repair information for a device may require fewer fuses to save repair information for the device.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 5 is a flowchart illustrating one embodiment of a method for testing memories of a device used in a circuit system.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
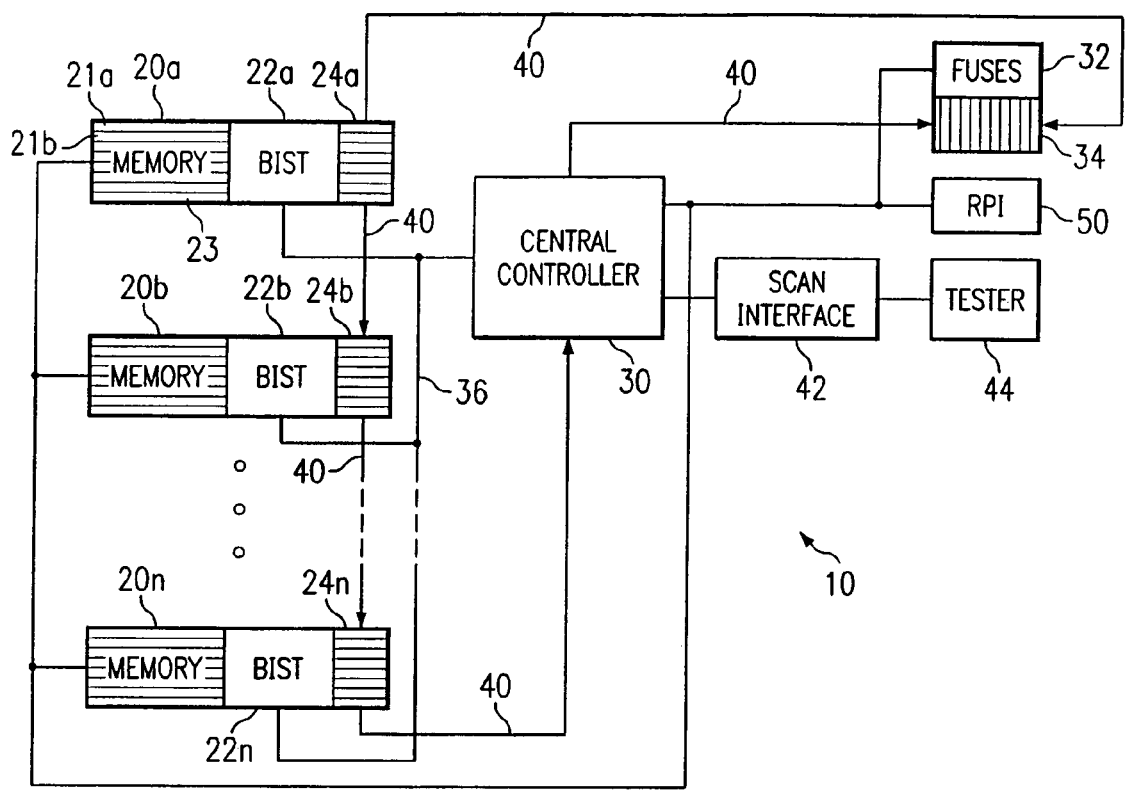
FIG. 1 is a block diagram of one embodiment of a device having one or more memories.

FIG. 1 is a block diagram of one embodiment of a device 10 having one or more memories 20. In general, memories 20 are tested and repaired, and the repair records are recorded as a base repair signature. Successive tests and repairs are performed on memories 20 under different conditions to generate successive repair signatures. The successive repair signatures are compared to the base repair signature to determine whether memories 20 have consistent failures. Memories 20 that have consistent failures may be repaired using the same repair records under a variety of conditions.

Specifically, device 10 includes any number n, for example, twenty-four, memories 20. A memory 20 may comprise, for example, a random-access memory (RAM) such as a static random-access memory (SRAM), or other suitable memory. Each memory 20 may comprise any number of rows 21, for example, 256 rows, that may be used to store information. "Each" as used in this document means each member of a set or each member of a subset of the set.

A memory 20 may include one or more spare rows 23. If any of the rows 21 of memory 20 is defective, a spare row 23 may be substituted for the defective row 21b using suitable techniques. According to one embodiment, spare row 23 may comprise a stronger memory cell. The stronger memory cell may be enabled to override defective row 21b without disabling defective row 21b. The stronger memory cell may comprise a memory cell that is able to output more current, for example, three to four times more current, on a read than rows 21 are able to output. The stronger memory cell may have separate read and write paths, where the write path is as strong as defective row 21b and the read path is stronger than defective row 21b.

Alternatively, spare row 23 may comprise a memory cell that is substantially equivalent in strength as defective row 21b. To substitute spare row 23 for defective row 21b in this alternative embodiment, defective row 21b may be disabled, and spare row 23 may be enabled.

Built-in self-testers (BISTs) 22 coupled to memories 20 test and repair memories 20. A built-in self-tester 22a identifies defective row 21b of a corresponding memory 20a, and substitutes spare row 23 for defective row 21b by recording the address of defective row 21b in a repair record stored in a repair register 24. Having a repair record for each memory 20 may allow for more flexible repair of memories 20. A repair record may, for example, indicate that no defective rows 21b were detected, or may provide the address of detected defective row 21b. A repair record may also, for example, indicate whether a valid repair can be performed on defective row 21b.

Built-in self-testers 22 may perform an initial test on memories 20 to produce repair records used to generate a base repair signature, and may perform successive tests on memories 20 to produce repair records used to generate successive repair signatures. A built-in self-tester 22 may comprise, for example, a IBM TESTBENCH TEAM built-in self-tester manufactured by IBM CORPORATION. Built-in self-testers 22 are described in more detail with reference to FIG. 2. Repair registers 24 coupled to built-in self-testers 22 store the repair records resulting from the tests, and also may serve to transfer the repair records to a central controller 30 for processing.

A status bus 36 may be used to inform central controller 30 of the status of the testing process. For example, each built-in self-tester 22 may send a status indicator to central controller 30 when built-in self-tester 22 has completed testing. The status indicator may indicate, for example, that testing is complete and no defective rows 21b were detected, testing is complete and detected defective rows 21b are repairable, or testing is complete and detected defective rows 21b are not repairable. Central controller 30 can determine when testing is complete and when to request the repair records. Status bus 36 may comprise one line for each bit of the status indicator for each built-in self-tester 22 or any other suitable number of lines to transport the status indicator.

A central controller 30 coupled to repair registers 24 generates a base repair signature and successive repair signatures from repair records and compares the repair signatures to evaluate memories 20. Central controller 30 may generate a repair signature by mathematically reducing the repair records from repair registers 24. The repair records may be reduced by, for example, generating a cyclic redundancy check (CRC) string by sequentially performing a cyclic redundancy check on the repair records. The cyclic redundancy check string may be generated according to a CRC-16 standard.

Central controller 30 generates a base repair signature from an initial test and successive repair signatures from successive tests. Tests may be run under different combinations of any suitable parameter values. According to one embodiment, memories 20 are tested with respect to different combinations of values for an operating voltage parameter and an operating temperature parameter. For example, if the operating voltage parameter has a maximum operating voltage and a minimum operating voltage and the operating temperature parameter has a maximum operating temperature and a minimum operating temperature, the following combinations may be tested: a maximum operating voltage with a maximum operating temperature, a maximum operating voltage with a minimum operating temperature, a minimum operating voltage with a maximum operating temperature, and a minimum operating voltage with a maximum operating temperature. Any suitable number of parameters and any suitable number of parameter values may be used. The base repair signature may be generated under test conditions that are expected to produce more failures. For example, memories 20 may be tested at a maximum operating temperature and a minimum operating voltage.

Memories 20 are evaluated in response to the comparison among the repair signatures to determine whether the failures, if any, at each memory 20 are consistent under a variety of conditions. That is, if a row x of memory 20a, row y of memory 20b, and so on fail during one test, then the same rows fail during each successive test. If memories 20 fail consistently, then the memories 20 may be repaired using the same repair records. According to one embodiment, device 10 with memories 20 that do not yield consistent repair signatures is rated as defective. Central controller 30 is described in more detail with reference to FIG. 3.

Fuses 32 store the base repair signature. A fuse register 34 coupled to central controller 30 stores the base repair signature after the signature is recorded in fuses 32 to allow central controller 30 and other components access to the base repair signature. Fuses 32 may include a fuse indicator that indicates that the base repair signature has been loaded into fuses 32. Central controller 30 may use the fuse indicator to determine whether fuses 32 are able to store the base repair signature or whether the base repair signature is available for comparison with successive repair signatures.

A scan chain 40 or other suitable bus may be used to transport repair records from built-in self testers 22 and the base repair signature from fuse register 34 to central controller 30. A repair record generated by a built-in self-tester 22 may be scanned through scan chain 40 to central controller 30 and returned to the built-in self-tester 22. Alternatively, each built-in self-tester 22 may have a register that is used to send a repair record to central controller 30 in addition to a register that stores the repair record.

A scan interface 42 scans test information from central controller 30. Central controller 30 may notify scan interface that testing is complete and that the test information is available. Scan interface 42 may comprise, for example, a Joint Test Action Group (JTAG) interface. Scan interface 42 may also be used to control the testing procedures performed by central controller 30. A tester 44 reports test information received by scan interface 42. Alternatively or additionally, a remote processor interface (RPI) 50 may be used to monitor memories 20, central controller 30, and fuses 32. Remote processor interface 50 may be able to provide more detailed information, such as the exact row of memory that has failed, than scan interface 42.

In operation, each built-in self-tester 22 performs an initial test on a corresponding memory 20 to determine if memory 20 has any defective rows 21b that can be repaired using spare row 23. Built-in self-tester 22 records a repair record in repair register 24, and sends a status indicator to central controller 30 through status bus 36. After testing of memories 20 is completed, the repair records are sent to central controller 30 through scan chain 40. Central controller 30 generates a base repair signature from the repair records. The base repair signature is read from central controller 30 using remote processor interface 50 or scan interface 42, and is communicated to an external mechanism that records the base repair signature in fuses 32.

Built-in self-testers 22 perform successive tests on memories 20 to generate successive repair records. Central controller 30 generates successive repair signatures from the successive repair records. Central controller 30 compares the successive repair signatures with the base repair signature and evaluates memories 20 in response to the comparison. According to one embodiment, device 10 may be identified as defective if successive repair signatures do not match the base repair signature. Accordingly, central controller 30 may be used to test that device 10 can be repaired under a variety of conditions.

Figure 2:
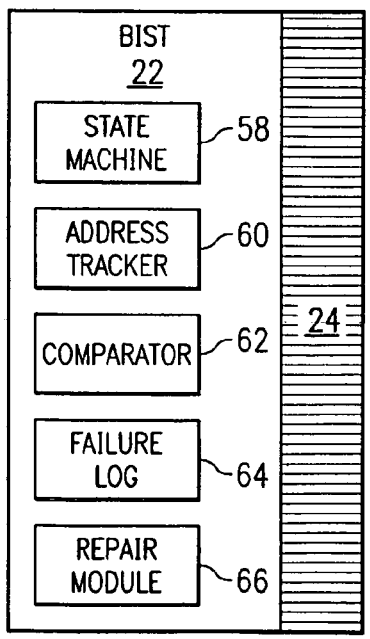
FIG. 2 is a block diagram of one embodiment of a built-in self-tester of FIG. 1.

FIG. 2 is a block diagram of one embodiment of a built-in self-tester 22 of FIG. 1. In general, built-in self-tester 22 supplies a series of patterns, for example, checker board patterns, to memory 20 and compares the output of memory 20 against a set of expected responses to identify any defective rows 21b. Built-in self-tester 22 records the address of a defective row 21b in a repair record, and repairs the defective row 21b by substituting a spare row 23 for the defective row 21b.

Specifically, built-in self-tester 22 may comprise a state machine 58, an address tracker 60, a comparator 62, a failure log 64, and a repair module 66. State machine 58 cycles through rows 21 of memory 20 to load a pattern. The pattern may comprise, for example, all zeros, all ones, or a checkerboard. Address tracker 60 tracks the address of the row 21 of memory 20 that is being tested.

Comparator 62 compares the output of memory 20 with expected responses. If the patterns are highly regular, outputs from memory 20 may be compared directly to the expected responses using comparator 62. Comparator 62 detects a defective row 21b and logs the address of the defective row 21b in failure log 64 as a repair record, which is copied to repair register 24. A repair record may indicate whether there are any defective rows 21b, the addresses of any defective rows 21b, and whether the defective rows 21b, if any, can be repaired. An example of such a repair record may include an address of a defective row 21b and a repair indicator indicating that the defective row 21b is repairable.

Repair module 66 uses the repair record stored in repair register 24 to repair memory 20. Repair module 66 compares an incoming address of a row to the address in the repair record. If the addresses match and if the repair indicator indicates that a repair can be performed, the spare row 23 is substituted for the row.

Figure 3:
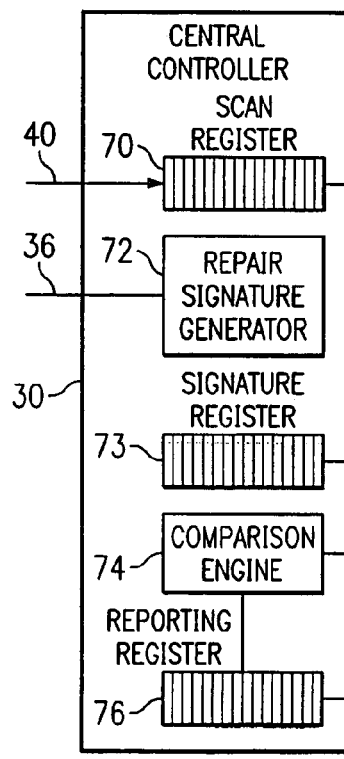
FIG. 3 is a block diagram illustrating one embodiment of a central controller of FIG. 1.

FIG. 3 is a block diagram illustrating one embodiment of central controller 30 of FIG. 1. In general, central controller 30 generates a base repair signature from repair records produced during an initial test and generates successive repair signatures from repair records produced during successive tests. Central controller 30 compares the successive repair signatures to the base repair signature in order to evaluate memories 20.

Specifically, central controller 30 may include a scan register 70, a repair signature generator 72, a signature register 73, a comparison engine 74, and a reporting register 76. Scan register 70 records the repair records received from repair registers 24 through scan chain 40. Repair signature generator 72 generates a repair signature from the repair records and stores the repair signature in signature register 73. Repair signature generator 72 may generate the repair signature by, for example, generating a cyclic redundancy string on the repair records. Scan interface 42 may be used to transmit the base repair signature to an external mechanism that records the base repair signature into fuses 32.

Comparison engine 74 compares successive repair signatures stored in signature register 73 with the base repair signature provided through scan chain 40. Comparison engine 74 may report the results of the comparison to reporting register 76. Reporting register 76 may also receive status information through status bus 36. Status information may include, for example, whether built-in self-testers 22 have completed testing. Scan interface 42 or remote processor interface 50 may be used to access reporting register 76.

Figure 4:
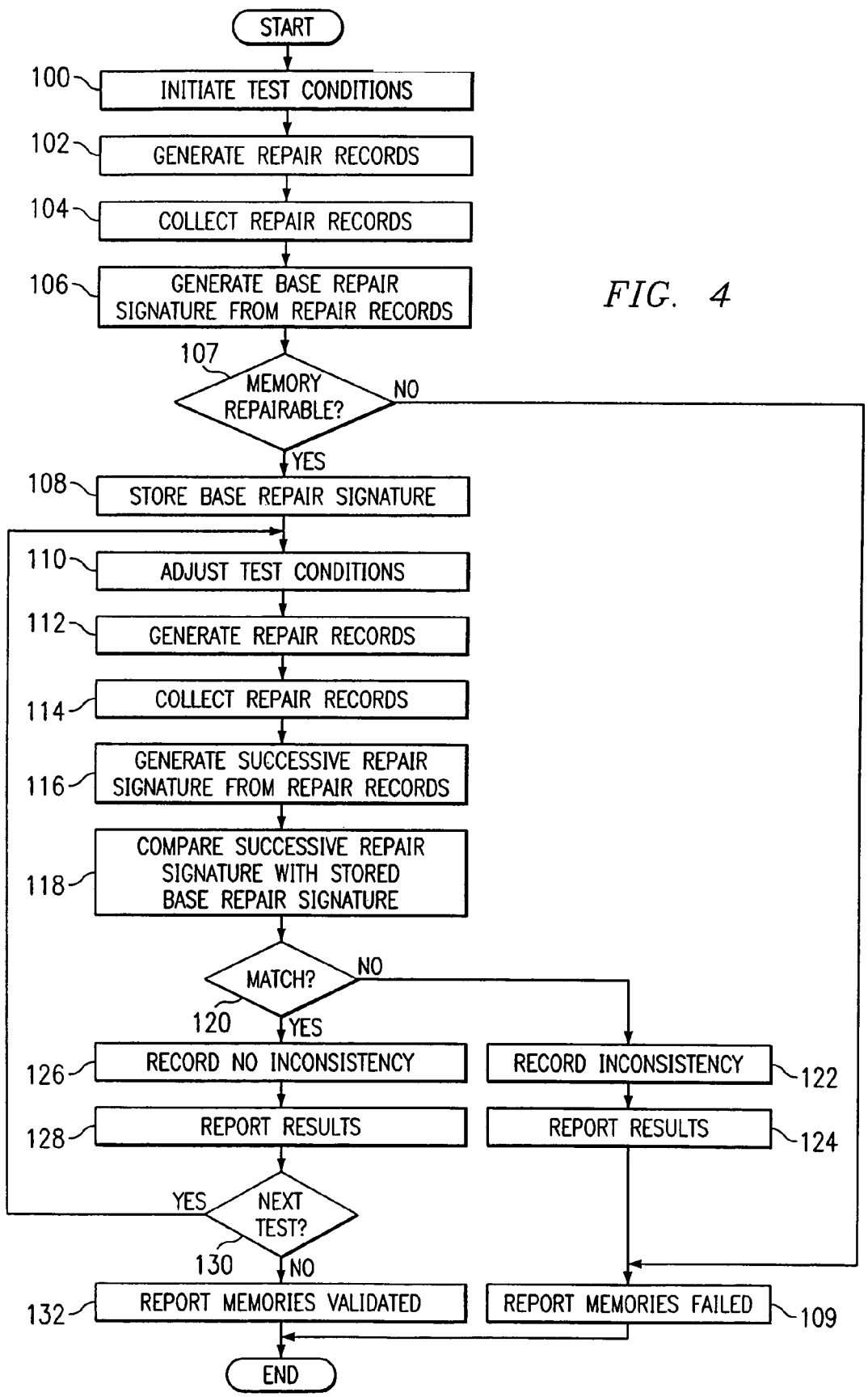
FIG. 4 is a flowchart illustrating one embodiment of a method for testing memories.

FIG. 4 is a flowchart illustrating one embodiment of a method for testing memories 20. According to the embodiment, a base repair signature is generated under initial test conditions. Successive repair signatures are generated under successive test conditions. The successive repair signatures are compared with the base repair signature in order to evaluate memories 20.

The method begins at step 100, where test conditions for an initial test are initiated. The test conditions may comprise, for example, a maximum operating temperature and a minimum operating voltage. Built-in self-testers 22 generate repair records at step 102. The repair records are collected using scan bus 40 at step 104. Central controller generates a base repair signature from the repair records at step 106. The repair records indicate whether memories 20 are repairable at step 107. If memories 20 are repairable, the method proceeds to step 108, where fuses 32 or other suitable static memory device are used to store the base repair signature. If the memories are not repairable, the method proceeds to step 109, where tester 44 reports that memories 20 have failed.

The test conditions are adjusted at step 110. For example, the operating voltage or the temperature may be adjusted. Built-in self-testers 22 generate repair records at step 112. The repair records are collected at step 114 using scan bus 40. Central controller 30 generates a successive repair signature from the repair records at step 116.

Comparison engine 74 of central controller 30 compares the successive repair signature with the stored base repair signature at step 118. A mismatch indicates that memories 20 have failures that are inconsistent under different conditions. If the successive repair signature does not match the stored repair signature at step 120, the method proceeds to step 122. Central controller 30 records the inconsistency in reporting register 76 at step 122. At step 124, reporting register 76 reports the results to tester 44 through scan interface 42. Tester 44 reports that memories 20 have failed at step 109. After the failure has been reported, the method terminates.

If the successive repair signature matches the base repair signature at step 120, the method proceeds to step 126. Central controller 30 records that there are no inconsistencies at step 126. Reporting register 76 reports the results to tester 44 through scan interface 42 at step 128, and the method proceeds to step 130. If there is a next test to be conducted at step 130, the method returns to step 110, where the test conditions are adjusted in order to perform the next test. If there is no next test at step 130, the method proceeds to step 132. At step 132, tester 44 reports that memories 20 have been validated. After the validation has been reported, the method terminates.

One skilled in the art will recognize that the steps of the method may be performed simultaneously or in any suitable order, and that some steps may be added or omitted. For example, some repair records may be generated at step 112, while other repair records are being collected at step 114.

FIG. 5 is a flowchart illustrating one embodiment of a method for testing memories 20 of device 10 used in a circuit system. Device 10 may be placed in a circuit system in order to provide memory functionality for the circuit system. Device 10 tests memories 20 and provides a notification if memories 20 fail.

The method begins at step 200, where a circuit system is reset by a host processor of the circuit system. The host processor initiates a test of memories 20 at step 202. The host processor may initiate the test by accessing device 10 through remote processor interface 50. Built-in self-testers 22 generate repair records at step 204. The repair records are collected using scan bus 40 at step 206. Central controller generates a repair signature from the repair records at step 208.

Comparison engine 74 of central controller 30 compares the repair signature with a stored base repair signature at step 210. The base repair signature may be stored at fuses 32. A mismatch indicates that memories 20 have failures that are inconsistent with the failures used to generated the base repair signature. If the repair signature does not match the base repair signature at step 212, the method proceeds to step 214. Device 10 reports to the host processor that memories 20 have failed at step 214. After the failure has been reported, the method terminates. If the repair signature matches the base repair signature at step 212, the method proceeds to step 216. Device 10 continues operation at step 216, and the method terminates.

One skilled in the art will recognize that the steps of the method may be performed simultaneously or in any suitable order, and that some steps may be added or omitted. For example, some repair records may be generated at step 204, while other repair records are being collected at step 206.

Certain embodiments of the invention may provide one or more technical advantages. A technical advantage of one embodiment may be that built-in self-testers 22 perform repairs for individual memories 20 of a device 10. Repairing each memory 20 individually may provide for more flexible repair of memories 20.

Another technical advantage of one embodiment may be that the memories 20 of a device 10 may be repaired under a variety of different conditions. Repair signatures generated from built-in self-testers 22 performing under different conditions are compared to each other. If the repair signatures match, the device 10 may be shown to perform self-repair under a variety of conditions. Another technical advantage of one embodiment may be that the base repair signature may be stored with a minimum number of storage locations, without compromising device testability when memories 20 are repaired.

Although an embodiment of the invention and its advantages are described in detail, a person skilled in the art could make various alterations, additions, and omissions without departing from the spirit and scope of the present invention as defined by the appended claims.

What is claimed is:

1. A method for testing one or more memories of a device, comprising:
   receiving one or more first repair records from one or more built-in self-testers of a device, the device comprising one or more memories, a built-in self-tester associated with a memory, a first repair record describing a first repair at a memory;
   generating a first repair signature from the one or more first repair records, wherein generating the first repair signature comprises mathematically reducing the one or more first repair records from one or more repair registers, the first repair signature corresponding to the first repairs at the one or more memories;
   recording the first repair signature;
   receiving one or more second repair records from the one or more built-in self-testers, a second repair record describing a second repair at a memory;
   generating a second repair signature from the one or more second repair records, the second repair signature corresponding to the second repairs at the one or more memories;
   comparing the second repair signature with the first repair signature; and
   evaluating the device in response to the comparison.

2. A central controller for testing one or more memories of a device, comprising:
   a scan register that operates to:
      receive one or more first repair records from one or more built-in self-testers; and
      receive one or more second repair records from one or more built-in self-testers;
   a repair signature generator that operates to:
      generate a first repair signature from the one or more first repair records by mathematically reducing the one or more first repair records from one or more repair registers; and
      generate a second repair signature from the one or more second repair records;
   a signature register that operates to record the first repair signature; and
   a comparison engine that operates to compare the second repair signature with the first repair signature stored in the signature register.

3. The central controller of claim 2, further comprising a reporting register that operates to:
   receive results from the comparison engine of the comparison between the first repair signature and the second repair signature; and
   report the results from the comparison engine.

4. A device for testing one or more memories of a device, comprising:
   one or more memories that operate to store data;
   one or more built-in self-testers coupled to the one or more memories, a built-in self-tester operates to:
      generate a first repair record describing a first repair at a memory; and
      generate a second repair record describing a second repair at a memory;
   a central controller coupled to the built-in self testers and that operates to:
      receive one or more first repair records from the one or more built-in self-testers;
      generate a first repair signature from the one or more first repair records, the first repair signature corresponding to the first repairs at the one or more memories;
      record the first repair signature;
      receive one or more second repair records from the one or more built-in self-testers;
      generate a second repair signature from the one or more second repair records, the second repair signature corresponding to the second repairs at the one or more memories;
      compare the second repair signature with the first repair signature; and
      evaluate the device in response to the comparison;
   one or more fuses coupled to the central controller and that operate to record the first repair signature;
   one or more repair registers coupled to the one or more built-in self-testers and that operate to receive the one or more second repair records; and
   a bus coupled to the one or more repair registers and to the one or more fuses and that operates to transfer the one or more second repair records from the one or more repair registers and to transfer the first repair signature from the one or more fuses.

5. The device of claim 4, wherein the one or more fuses operate to indicate whether the first repair signature is recorded.

6. The device of claim 4, wherein the one or more fuses operate to provide the central controller with access to the first repair signature.

* * * * *